United States Patent
Lee

(10) Patent No.: US 8,946,032 B2
(45) Date of Patent: Feb. 3, 2015

(54) METHOD OF MANUFACTURING POWER DEVICE

(75) Inventor: Jae Hoon Lee, Suwon-si (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 182 days.

(21) Appl. No.: 13/543,553

(22) Filed: Jul. 6, 2012

(65) Prior Publication Data

US 2013/0017657 A1 Jan. 17, 2013

(30) Foreign Application Priority Data

Jul. 12, 2011 (KR) .................. 10-2011-0068937

(51) Int. Cl.
*H01L 21/336* (2006.01)
*H01L 21/28* (2006.01)
(Continued)

(52) U.S. Cl.
CPC ........ *H01L 21/28264* (2013.01); *H01L 29/517* (2013.01); *H01L 29/66522* (2013.01); *H01L 29/78* (2013.01); *H01L 21/0237* (2013.01);
(Continued)

(58) Field of Classification Search
CPC ............... H01L 21/28264; H01L 29/66628; H01L 29/66196; H01L 29/7834
USPC ............ 438/285, 498, 504; 257/15, E21.097, 257/E21.108, E21.172, E21.407
See application file for complete search history.

(56) References Cited

U.S. PATENT DOCUMENTS

| 4,981,808 | A | * | 1/1991 | Hayes ........................... 438/492 |
| 5,762,706 | A | * | 6/1998 | Saito et al. .................... 117/105 |

(Continued)

FOREIGN PATENT DOCUMENTS

| CN | 101415868 A | 4/2009 |
| EP | 2546881 A2 * | 1/2013 |

(Continued)

OTHER PUBLICATIONS

Office Action Chinese Patent Application No. 201210240804.X dated Jul. 17, 2014 with English translation.
(Continued)

*Primary Examiner* — Zandra Smith
*Assistant Examiner* — Toniae Thomas
(74) *Attorney, Agent, or Firm* — McDermott Will & Emery LLP

(57) ABSTRACT

A power device manufacturing method is provided. The power device manufacturing method may perform patterning of regions on which a source electrode and a drain electrode are to be formed, may regrow $n^+$-gallium nitride (GaN) and $p^+$-GaN in the patterned regions and thus, a thin film crystal may not be damaged. Also, a doping concentration of $n^+$-GaN or $p^+$-GaN may be adjusted, an ohmic resistance in the source electrode region and the drain electrode region may decrease, and a current density may increase. The power device manufacturing method may regrow $n^+$-GaN and $p^+$-GaN at a high temperature after an n-GaN layer and a p-GaN layer are patterned. Accordingly, a thin film crystal may not be damaged and thus, a reliability may be secured, and an annealing process may not be additionally performed and thus, a process may be simplified and a cost may be reduced.

20 Claims, 4 Drawing Sheets

(51) Int. Cl.
  *H01L 29/51* (2006.01)
  *H01L 29/66* (2006.01)
  *H01L 29/78* (2006.01)
  *H01L 21/02* (2006.01)

(52) U.S. Cl.
  CPC ....... *H01L21/02502* (2013.01); *H01L 21/0254* (2013.01); *H01L 21/02576* (2013.01); *H01L 21/02639* (2013.01)
  USPC .... 438/285; 438/498; 438/504; 257/E21.097; 257/E21.108; 257/E21.172; 257/E21.407

(56) References Cited

U.S. PATENT DOCUMENTS

| | | | | |
|---|---|---|---|---|
| 5,827,751 | A * | 10/1998 | Nuyen | 438/28 |
| 6,190,975 | B1 * | 2/2001 | Kubo et al. | 438/285 |
| 6,498,360 | B1 * | 12/2002 | Jain et al. | 257/194 |
| 7,589,360 | B2 * | 9/2009 | Matocha et al. | 257/192 |
| 7,704,836 | B2 | 4/2010 | Pattanayak et al. | |
| 2003/0209811 | A1 * | 11/2003 | Holm et al. | 257/784 |
| 2003/0227027 | A1 * | 12/2003 | Micovic et al. | 257/192 |
| 2004/0061129 | A1 * | 4/2004 | Saxler et al. | 257/192 |
| 2007/0155063 | A1 * | 7/2007 | Datta et al. | 438/142 |
| 2008/0121927 | A1 | 5/2008 | Matocha et al. | |
| 2008/0128753 | A1 * | 6/2008 | Parikh et al. | 257/194 |
| 2008/0169483 | A1 * | 7/2008 | Kasai et al. | 257/183 |
| 2009/0155580 | A1 | 6/2009 | Shibata et al. | |
| 2010/0044753 | A1 * | 2/2010 | Sugimoto et al. | 257/192 |
| 2010/0163847 | A1 * | 7/2010 | Majhi et al. | 257/24 |
| 2010/0283083 | A1 | 11/2010 | Niiyama et al. | |
| 2010/0301392 | A1 * | 12/2010 | Ko et al. | 257/192 |
| 2011/0079822 | A1 * | 4/2011 | Kanamura | 257/192 |
| 2011/0186855 | A1 * | 8/2011 | Ramdani | 257/76 |
| 2011/0272708 | A1 * | 11/2011 | Yoshioka et al. | 257/77 |
| 2012/0231596 | A1 * | 9/2012 | Majhi et al. | 438/285 |
| 2012/0248501 | A1 * | 10/2012 | Cheng et al. | 257/192 |
| 2013/0032811 | A1 * | 2/2013 | Kizilyalli et al. | 257/76 |
| 2013/0032860 | A1 * | 2/2013 | Marino et al. | 257/194 |
| 2013/0062664 | A1 * | 3/2013 | Takeuchi et al. | 257/190 |
| 2013/0168698 | A1 * | 7/2013 | Lee et al. | 257/77 |

FOREIGN PATENT DOCUMENTS

| | | |
|---|---|---|
| JP | 2007-335677 A | 12/2007 |
| JP | 2010-141349 | 6/2010 |
| KR | 10-0562328 B1 | 3/2006 |

OTHER PUBLICATIONS

H. Teisseyre, et al., "Homoepitaxial Layers of Gallium Nitrid Grown by Metalorganic Vapour Phase Epitaxy," Semicond. Sci. Technol. 12 (1997) 240-243, IOP Publishing Ltd.

Jin-Kuo Ho, et al., "Low-resistance ohmic contacts to p-type GaN achieved by the oxidation of Ni/Au films" Journal of Applied Physics, vol. 86, No. 8, Oct. 15, 1999, pp. 4491-4497, American Institute of Physics, 1999.

M. Ueda et al., "Epitaxial growth and optical properties of semipolar (1122) GaN and InGaN/GaN quantum wells on GaN bulk substrates" Applied Physics Letters 89, 211907 (2006), American Intitute of Physics.

European Search Report issued in European Application No. 12175634.0-1552 dated Oct. 10, 2014.

* cited by examiner

METHOD OF MANUFACTURING POWER DEVICE

CROSS-REFERENCE TO RELATED APPLICATION

This application claims the benefit of Korean Patent Application No. 10-2011-0068937, filed on Jul. 12, 2011, in the Korean Intellectual Property Office, the disclosure of which is incorporated herein by reference.

BACKGROUND

1. Field of the Invention

The present invention relates to a power device manufacturing method, and more particularly, to a power device manufacturing method that manufactures a power device that is capable of performing a normally-OFF operation.

2. Description of the Related Art

A semiconductor light emitting device (LED) is a semiconductor device that generates various colored lights based on the re-bonding of an electron and a hole at a P-N junction when a current is applied. Demand for the semiconductor LED has been continuously increased since the semiconductor LED has many advantages, for example, a long lifespan, a low power consumption, a fast start-up, a high vibration resistance, and the like, when compared to a filament-based LED. Particularly, a nitride semiconductor that emits a blue light, in a short wavelength range, has drawn attention.

As information communication technologies have been considerably developed globally, communication technologies for high-speed and large-capacity signal communication have also been rapidly developed. Particularly, as demand for a personal cellular phone, a satellite communication, a military radar, a broadcasting communication, a communication relay, and the like in wireless communication technology has increased, the demands for a high-speed, a high-power electronic device required for a high-speed information communication system of a microwave band and a millimeter-wave band have increased. Also, research on a power device used for a high-power have been actively conducted to reduce energy loss.

Particularly, since the nitride semiconductor has advantageous properties, such as a high energy gap, a high heat stability, a high chemical stability, a high electronic saturation velocity of about $3 \times 10^7$ centimeters per second (cm/sec), the nitride semiconductor may be readily utilized as an optical element, and a high frequency and high power electronic device. Accordingly, research on the nitride semiconductor is being actively conducted the world over. An electronic device based on the nitride semiconductor may have varied advantages, such as, a high breakdown field of about $3 \times 10^6$ volts per centimeter (V/cm), a maximum current density, a stable high temperature operation, a high heat conductivity, and the like.

A heterostructure field effect transistor (HFET) generated based on a heterojunction of compound semiconductors has a high band-discontinuity at a junction interface, a high-electron density may be freed in the interface and thus, an electron mobility may increase. However, in an aluminum gallium nitride (AlGaN)/gallium nitride (GaN) HFET structure having a high electron mobility, a current flows even in a state where a signal is not applied and thus, power is consumed.

Since a power device may require a high current density, power loss in a normally-ON device may be a great drawback. Accordingly, a normally-OFF device that embodies a metal-oxide semiconductor (MOS) HFET by removing an AlGaN layer from a gate portion has been developed.

There is an attempt to embody a normally-OFF device using a nitride-based semiconductor, in the same manner as the MOS HFET of a Si base, since it is difficult to control the AlGaN layer to have a required thickness. In this example, an implantation device may be used to provide, to a source region and a drain region, the same carrier as the channel layer. Also, a process, for example, a heat treatment and the like, may be performed to activate a carrier.

SUMMARY

An aspect of the present invention provides a power device manufacturing method that manufactures a power device that is capable of performing a normally-OFF operation.

According to an aspect of the present invention, there is provided a power device manufacturing method, the method including forming a buffer layer on a substrate, forming a p-gallium nitride (GaN) layer on the buffer layer, forming a first region and a second region by patterning the p-GaN layer, forming an $n^+$-GaN layer by regrowing GaN in the first region and the second region, and forming a source electrode and a drain electrode on the $n^+$-GaN layer.

The buffer layer may include a first buffer layer and a second buffer layer.

A doping concentration of the $n^+$-GaN layer may be in a range from about $1.0 \times 10^{16}/cm^3$ to about $1.0 \times 10^{20}/cm^3$.

The forming of the $n^+$-GaN layer may be performed in a temperature range from about from about 1000° C. to about 1200° C.

The source electrode and the drain electrode formed on the $n^+$-GaN layer may be selected from chromium (Cr), aluminum (Al), tantalum (Ta), titanium (Ti), and gold (Au).

The power device manufacturing method may further include forming a bonding layer and a thermal conductive substrate after the substrate is removed, and the substrate may be an insulating substrate.

According to an aspect of the present invention, there is provided a power device manufacturing method, the method including forming a buffer layer on a substrate, forming a GaN layer on the buffer layer, forming a first region and a second region by patterning the n-GaN layer, forming a $p^+$-GaN layer by regrowing GaN in the first region and the second region, and forming a source electrode and a drain electrode on the $p^+$-GaN layer.

A doping concentration of the $p^+$-GaN layer may be in a range from about $1.0 \times 10^{16}/cm^3$ to about $1.0 \times 10^{20}/cm^3$.

The forming of the $p^+$-GaN layer may be performed in a temperature range from about 1000° C. to about 1200° C.

The source electrode and the drain electrode formed on the $p^+$-GaN layer may be selected from nickel (Ni), Au, copper indium oxide ($CuInO_2$), indium tin oxide (ITO), platinum (Pt), and alloys thereof.

The source electrode and the drain electrode formed on the $p^+$-GaN layer may be selected from an alloy of Ni and Au, an alloy of $CuInO_2$ and Au, an alloy of ITO and Au, an alloy of Ni, Pt, and Au, and an alloy of Pt and Au.

Additional aspects, features, and/or advantages of the invention will be set forth in part in the description which follows and, in part, will be apparent from the description, or may be learned by practice of the invention.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
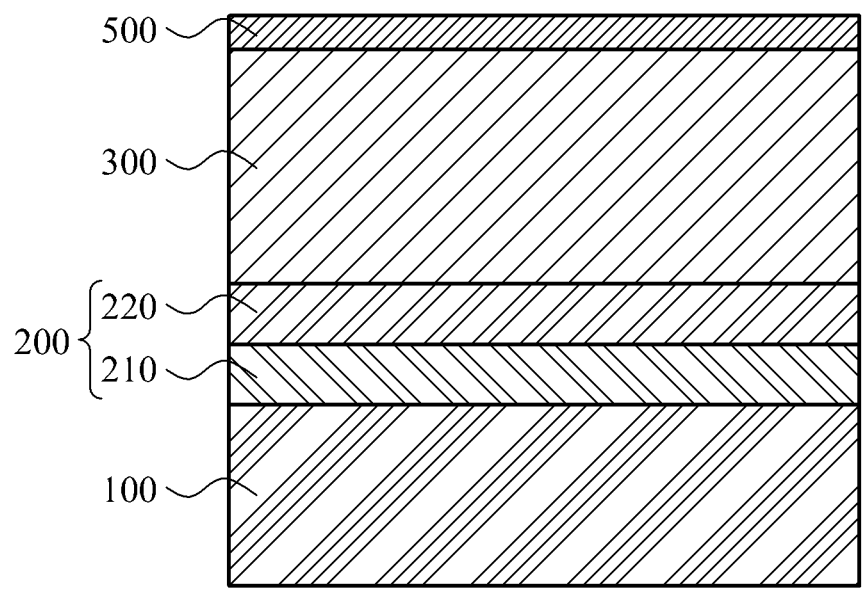
FIGS. 1 through 6 are sectional views illustrating a power device manufacturing method according to an embodiment of the present invention.

Reference will now be made in detail to embodiments of the present invention, examples of which are illustrated in the accompanying drawings, wherein like reference numerals refer to the like elements throughout. Embodiments are described below to explain the present invention by referring to the figures.

Throughout the specifications, when it is described that each of a layer, a side, a chip, and the like is formed "on" or "under" a layer, a side, a chip, and the like, the term "on" may include "directly on" and "indirectly on," and the term "under" may include "directly under" and "indirectly under." A standard for "on" or "under" of each element may be determined based on a corresponding drawing.

A size of each element in the drawings may be exaggerated for ease of descriptions, and does not indicate a real size.

FIGS. 1 through 6 illustrate sectional views of a power device manufacturing method according to an embodiment of the present invention.

Referring to FIGS. 1 through 6, the power device manufacturing method may include forming a buffer layer 200 on a substrate 100, forming a p-gallium nitride (GaN) layer 300 on the buffer layer 200, forming a first region 410a and a second region 420a by patterning the p-GaN layer 300, forming n+-GaN layers 410 and 420 by regrowing GaN in the first region 410a and the second region 420a, and forming a source electrode 610 and a drain electrode 620 on the n+-GaN layers 410 and 420.

As shown in FIG. 1, the buffer layer 200, the p-GaN layer 300, and a first insulating layer 500 are formed on the substrate 100. The substrate 100 may be an insulating substrate, for example, a glass substrate and a sapphire substrate, or may be a conductive substrate, for example, a silicon (Si) substrate, a silicon carbide (SiC) substrate, and a zinc oxide (ZnC) substrate. The substrate 100 may be a substrate for growing nitride, for example, an aluminum nitride (AlN)-based structure or a GaN-based structure.

The buffer layer 200 may be formed based on various schemes, for example, a metal-organic chemical vapor deposition (MOCVD) scheme, a molecular beam epitaxy (MBE) scheme, and a hydride vapor phase epitaxy (HVPE) scheme, and the like, and the examples may not be limited thereto.

The buffer layer 200 may include a first buffer layer 210 and a second buffer layer 220, but a configuration of the buffer layer 200 is not limited thereto. Even though the first buffer layer 210 may include SiC or GaN, a material that is appropriate for growing GaN on the first buffer layer 210 may also be used. The second buffer layer 220 may include non-doped-GaN, and a material that is appropriate for growing p-GaN or n-GaN may also be used. The buffer layer 200 may be used for reducing a lattice mismatch between the substrate 100 and a layer formed on an upper portion of the substrate 100, and may be used for readily growing the layer formed on the upper portion.

The p-GaN layer 300 may be formed on the buffer layer 200. The p-GaN layer 300 may be formed based on various schemes. A channel layer may be formed on a portion corresponding to a gate electrode 630, on the upper portion of the p-GaN layer 300.

After forming the p-GaN layer 300, the first insulating layer 500 may be formed to perform patterning of a portion of the p-GaN layer 300 based on a photolithography process. The first insulating layer 500 may include silicon dioxide ($SiO_2$) or silicon nitride ($SiN_x$).

Figure 2:
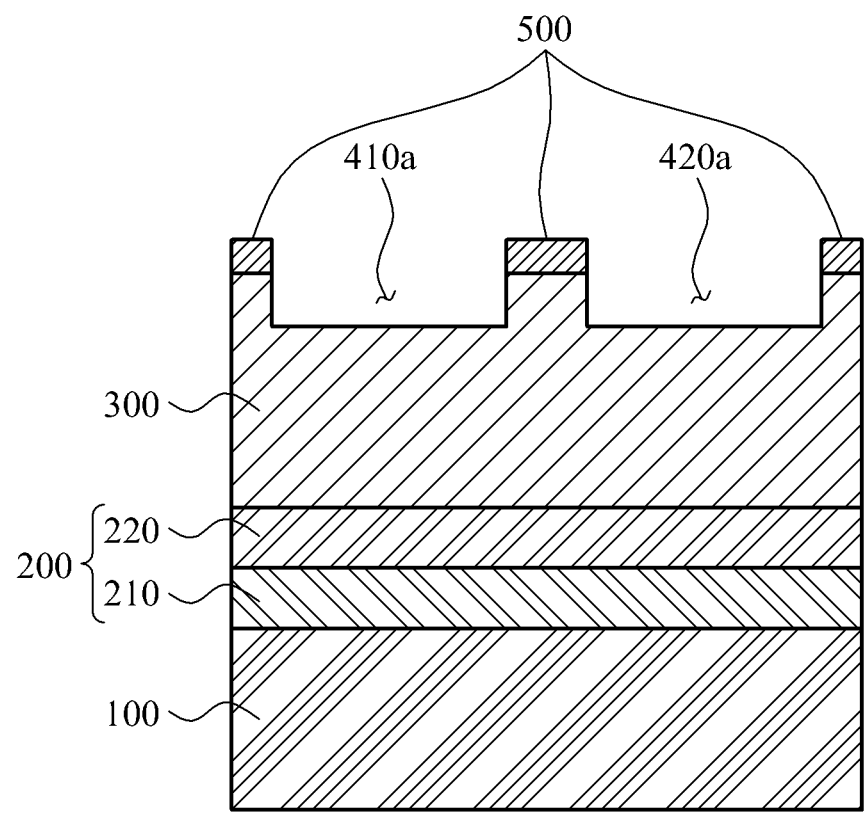

Subsequently, as shown in FIG. 2, a portion of the first insulating layer 500 may be etched and removed. A portion corresponding to the source electrode 610 and a portion corresponding to the drain electrode 620 may be removed from the first insulating layer 500 and thus, the p-GaN layer 300 may be exposed. A portion of the exposed p-GaN layer 300 may be etched based on a dry etching scheme and thus, the first region 410a and the second region 420a may be formed.

Figure 3:
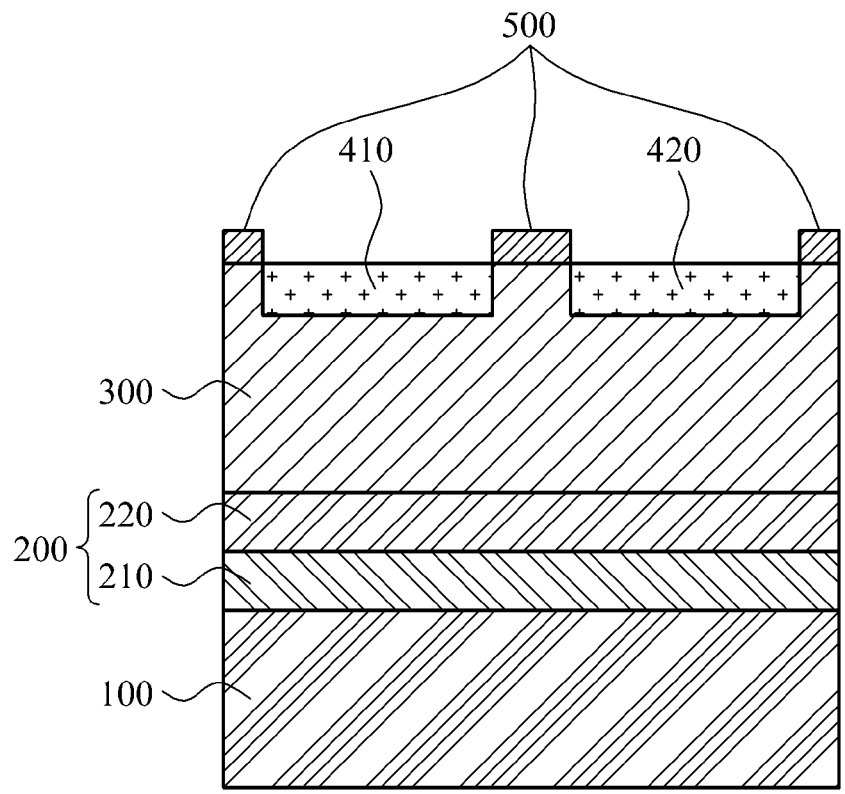

As shown in FIG. 3, GaN may be regrown in the first region 410a and the second region 420a and thus, the n+-GaN layers 410 and 420 may be formed. The n+-GaN layers 410 and 420 may be formed by regrowing GaN based on a MOCVD scheme. The n+-GaN layers 410 and 420 may be regrown on the exposed p-GaN layer 300, and a doping concentration of n+-GaN may be in a range from about $1.0\times10^{16}/cm^3$ to about $1.0\times10^{20}/cm^3$.

The n+-GaN layers 410 and 420 are formed by a regrowth scheme, so that a doping concentration of n+-GaN may be adjusted and a thin film crystal may not be damaged. Accordingly, an ohmic resistance in a source electrode region and a drain electrode region may decrease, and a current density may increase.

The forming of the n+-GaN layers 410 and 420 may be performed in a temperature range from about 1000° C. to about 1200° C. The n+-GaN layers 410 and 420 may be regrown at a high temperature. Accordingly, a thin film crystal may not be damaged and thus, a reliability may be secured, and an annealing process may not be additionally performed and thus, a process may be simplified and a cost may be reduced.

Figure 4:
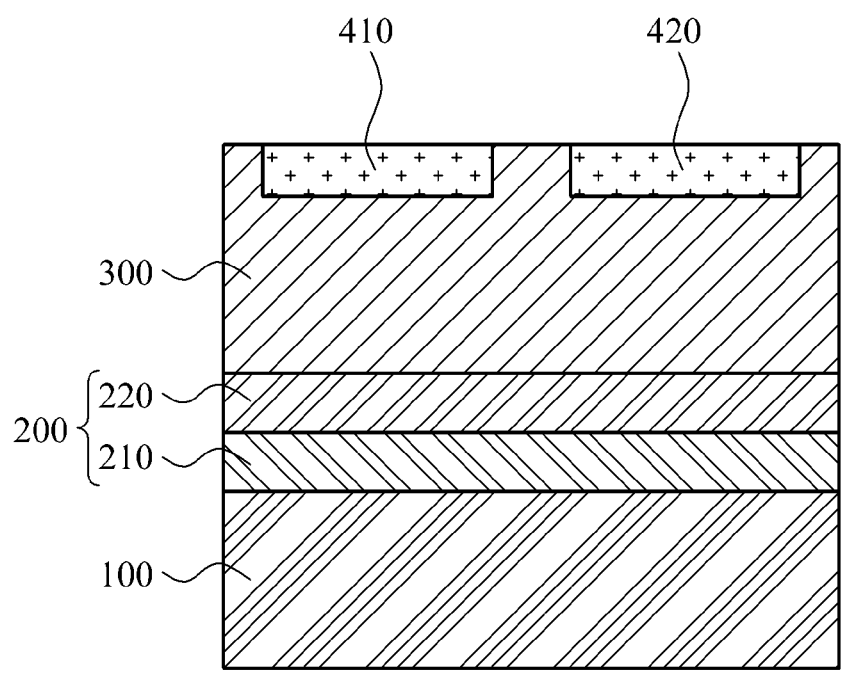
Figure 5:
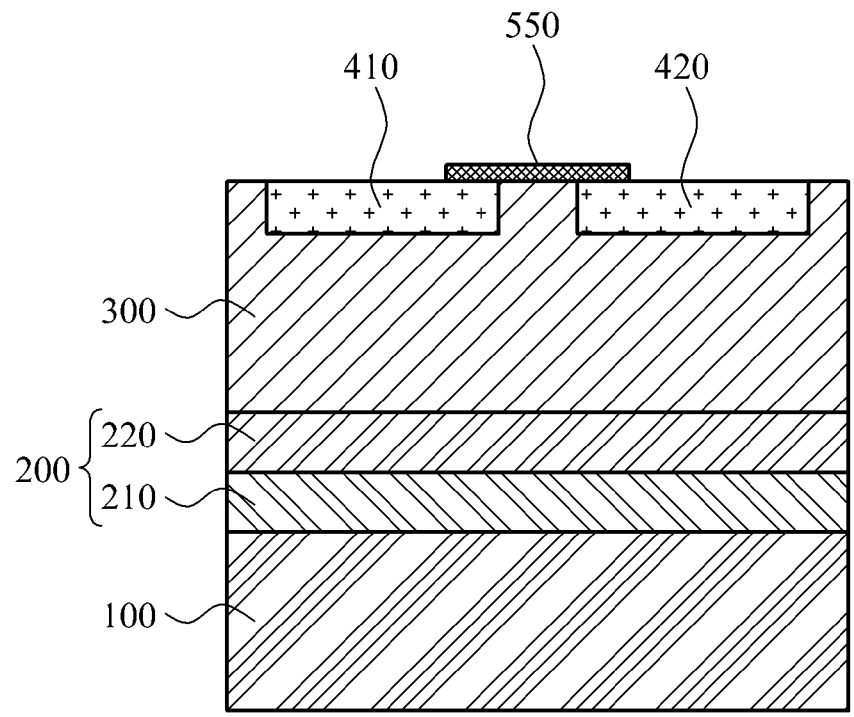

As shown in FIG. 4, the first insulating layer 500 may be removed after the n+-GaN layers 410 and 420 are formed. Subsequently, a second insulating layer 550 is formed between the n+-GaN layers 410 and 420, as shown in FIG. 5. The second insulating layer 550 may be formed on a position corresponding to a position on which the gate electrode 630 is formed. The second insulating layer 550 may include a material selected from $SiO_2$, $SiN_x$, aluminum oxide ($Al_2O_3$), hafnium oxide ($HfO_2$), and gallium oxide ($Ga_2O_3$).

Figure 6:
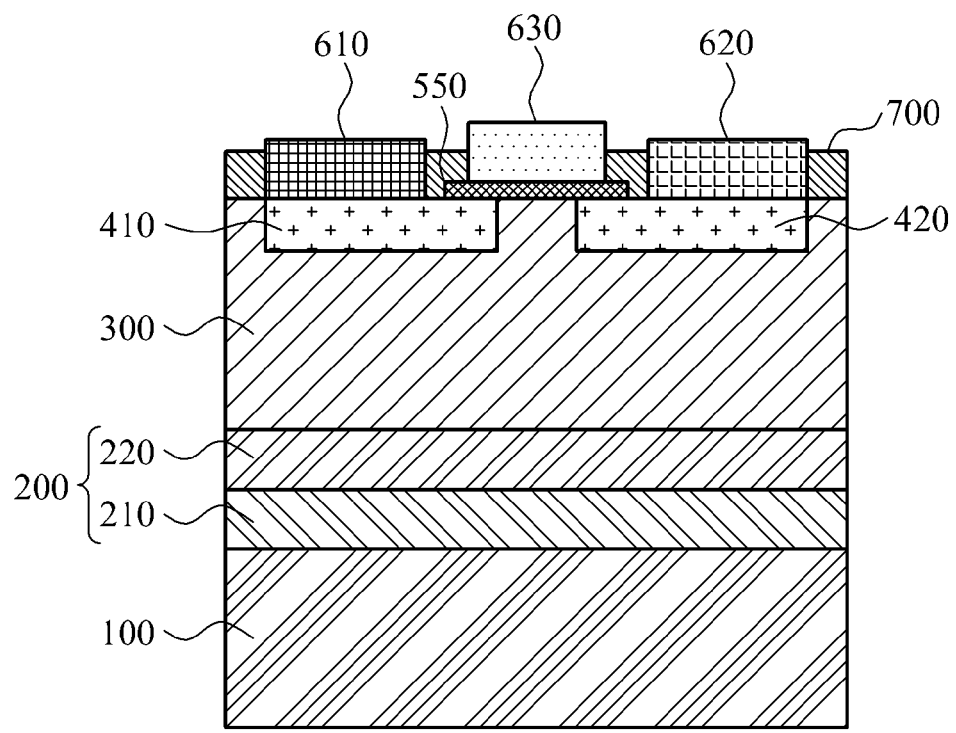

Subsequently, a third insulating layer 700 is formed, and the source electrode 610, the drain electrode 620, and the gate electrode 630 may be formed, as shown in FIG. 6.

The source electrode 610 and the drain electrode 620 may be formed on positions corresponding the n+-GaN layers 410 and 420 grown from the exposed p-GaN layer 300, and the source electrode 610 and the drain electrode 620 on the n+-GaN layers 410 and 420 may include a material selected from chromium (Cr), aluminum (Al), tantalum (Ta), titanium (Ti), and gold (Au).

The gate electrode 630 may be formed on a position corresponding to the second insulating layer 550 that is a gate insulating layer, and may be formed between the source electrode 610 and the drain electrode 620. The gate electrode 630 may include a material selected from nickel (Ni), Al, Ti, titanium nitride (TiN), platinum (Pt), Au, ruthenium oxide ($RuO_2$), vanadium (V), tungsten (W), wolfram nitride (WN), hafnium (Hf), HfN, molybdenum (Mo), nickel silicide (NiSi), cobalt silicide ($CoSi_2$), tungsten silicide (WSi), platinum silicide (PtSi), iridium (Ir), zirconium (Zr), Ta, tantalum nitride (TaN), copper (Cu), ruthenium (Ru), cobalt (Co), and combinations thereof, but the material is not limited thereto.

The third insulating layer 700 may include a material selected from $SiO_x$, $SiN_x$, $Al_2O_3$, and SiC. The third insulating layer 700 may insulate the gate electrode pattern 610, the source electrode pattern 620, and the drain electrode pattern 630 so as to prevent a short from occurring between electrodes.

Even through a case of forming of the p-GaN layer 300 and the $n^+$-GaN layers 410 and 420 has been described in the foregoing, an n-GaN layer and $p^+$-GaN layers may be formed instead of the p-GaN layer 300 and the $n^+$-GaN layers 410 and 420. A method of forming the n-GaN layer and the $p^+$-GaN layers may also include the regrowth scheme and the operations described in the foregoing.

That is, GaN is regrown in a first region and a second region where the n-GaN layer is exposed, in the same manner as FIG. 3. The $p^+$-GaN layers may be regrown on the exposed n-GaN layer, and a doping concentration of $p^+$-GaN may be in a range from about $1.0 \times 1016/cm^3$ to $1.0 \times 1020/cm^3$. The $p^+$-GaN layers are formed based on the regrowth scheme, so that a doping concentration of $p^+$-GaN may be adjusted and a thin film crystal may not be damaged. Also, an ohmic resistance in a source electrode region and a drain electrode region may decrease, and a current density may increase.

The forming of the $p^+$-GaN layers may be performed at a high temperature, for example, in a range from about 1000° C. to about 1200° C. Accordingly, a thin film crystal may not be damaged and thus, a reliability may be secured, and an annealing process may not be additionally performed and thus, a process may be simplified and a cost may be reduced.

A source electrode and a drain electrode may be formed on positions corresponding to the $p^+$-GaN layers grown from the exposed n-GaN layer, and the source electrode and the drain electrode on the $p^+$-GaN layers may include a material selected from Ni, Au, $CuInO_2$, ITO, Pt, and alloys thereof. Examples of the alloys may include an alloy of $CuInO_2$ and Au, an alloy of ITO and Au, an alloy of Ni, Pt, and Au, and an alloy of Pt and Au, however, the examples are not limited thereto.

Figure 7:
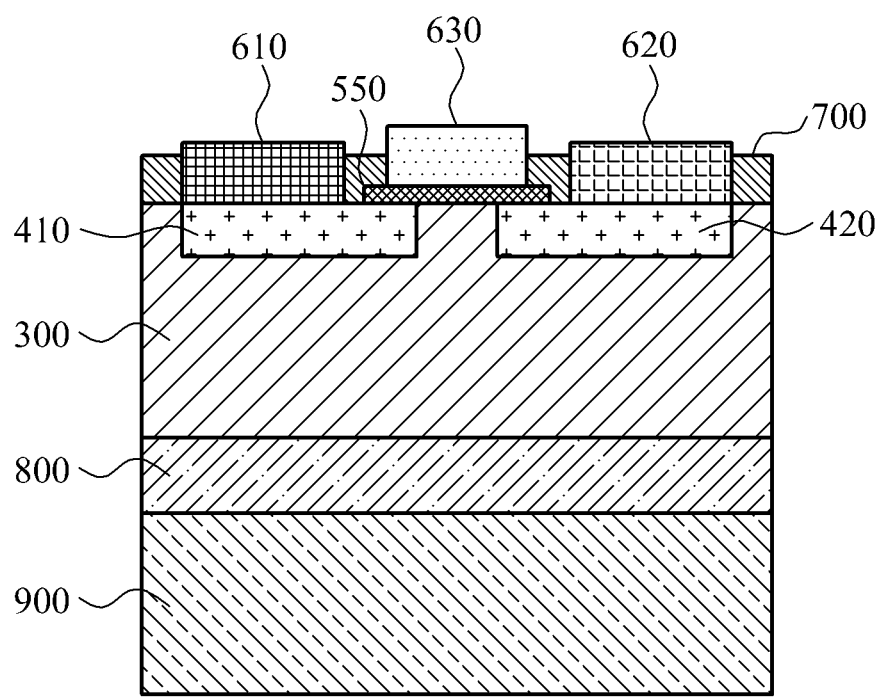
FIG. 7 is a sectional view illustrating a power device manufactured according to another embodiment of the present invention.

FIG. 7 illustrates sectional views of a power device manufactured according to another embodiment of the present invention. A wafer bonding scheme and a laser lift off scheme will be described to avoid descriptions from overlapping with those provided in the foregoing.

When the substrate 100 is an insulating substrate, such as a sapphire substrate, the p-GaN layer 300 or an n-GaN layer may be formed on the substrate 100, and the source electrode 610, the drain electrode 620, and the gate electrode 630 may be formed. Subsequently, the sapphire substrate and the buffer layer 200 may be removed based on the laser lift off process, and a bonding layer 800 and a thermal conductive substrate 900 may be formed. The bonding layer 800 may be disposed between the p-GaN layer 300, or the n-GaN layer, and the thermal conductive substrate 900. Even through the bonding layer 800 may include gold-Tin (AuSn), a material that bonds the thermal conductive substrate 900 may also be used. The thermal conductive substrate 900 may be formed after the bonding layer 800 is formed. The thermal conductive substrate 900 may include Si, Al—Si or a metal, but the material is not limited thereto.

In the power device manufactured according to the other embodiment of the present invention, a channel layer may be formed on a portion corresponding to the gate electrode 630, on an upper portion of the p-GaN layer 300 or n-GaN layer, the $n^+$-GaN layers 410 and 420 or $p^+$-GaN layers may be formed on positions corresponding to a source region and a drain region and thus, the power device may be capable of performing a normally-OFF operation so as to reduce power consumption.

According to embodiments of the present invention, a power device manufacturing method may perform patterning of regions on which a source electrode and a drain electrode are to be formed, may regrow $n^+$-GaN and $p^+$-GaN in the patterned regions and thus, a thin film crystal may not be damaged. Also, a doping concentration of $n^+$-GaN or $p^+$-GaN may be adjusted, an ohmic resistance in the source electrode region and the drain electrode region may decrease, and a current density may increase.

According to embodiments of the present invention, a power device manufacturing method may regrow $n^+$-GaN and $p^+$-GaN at a high temperature after an n-GaN layer and a p-GaN layer are patterned. Accordingly, a thin film crystal may not be damaged and thus, a reliability may be secured, and an annealing process may not be additionally performed and thus, a process may be simplified and a cost may be reduced.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A method of manufacturing a power device, the method comprising:
   forming a buffer layer on a substrate;
   forming a p-gallium nitride (GaN) layer on the buffer layer;
   forming a first region and a second region by etching away the p-GaN layer in the first region and the second region:
   forming an $n^+$-GaN layer by regrowing GaN in the first region and the second region;
   forming a source electrode and a drain electrode on the $n^+$-GaN layer;
   removing the substrate from a surface of the p-GaN layer following the forming of the source electrode and the drain electrode; and
   forming a bonding layer and disposing a thermal conductive substrate on the surface of the p-GaN layer from which the substrate is removed after the substrate is removed.

2. The method of claim 1, wherein the buffer layer comprises a first buffer layer and a second buffer layer.

3. The method of claim 1, wherein a doping concentration of the $n^+$-GaN layer is in a range from $1.0 \times 10^{16}/cm^3$ to $1.0 \times 10^{20}/cm^3$.

4. The method of claim 1, wherein the forming of the $n^+$-GaN layer is performed in a temperature range from 1000° C. to 1200° C.

5. The method of claim 1, wherein the source electrode and the drain electrode formed on the $n^+$-GaN layer is selected from a group consisting of chromium (Cr), aluminum (Al), tantalum (Ta), titanium (Ti), and gold (Au).

6. The method of claim 1,
   wherein the substrate on which the p-GaN layer is formed is an insulating substrate.

7. A method of manufacturing a power device, the method comprising:
   forming a buffer layer on a substrate;
   forming an n-gallium nitride (GaN) layer on the buffer layer;
   forming a first region and a second region by etching away the n-GaN layer in the first region and the second region;

forming a p⁺-GaN layer by regrowing GaN in the first region and the second region;

forming a source electrode and a drain electrode on the p⁺-GaN layer;

removing the substrate from a surface of the n-GaN layer following the forming of the source electrode and the drain electrode; and forming a bonding layer and disposing a thermal conductive substrate on the surface of the n-GaN layer from which the substrate is removed after the substrate is removed.

8. The method of claim 7, wherein a doping concentration of the p⁺-GaN layer is in a range from $1.0 \times 10^{16}/cm^3$ to $1.0 \times 10^{20}/cm^3$.

9. The method of claim 7, wherein the forming of the p⁺-GaN layer is performed in a temperature range from 1000° C. to 1200° C.

10. The method of claim 7, wherein the source electrode and the drain electrode formed on the p⁺-GaN layer is selected from a group consisting of nickel (Ni), Au, copper indium oxide ($CuInO_2$), indium tin oxide (ITO), platinum (Pt), and alloys thereof.

11. The method of claim 10, wherein the source electrode and the drain electrode formed on the p⁺-GaN layer is selected from a group consisting of an alloy of Ni and Au, an alloy of $CuInO_2$ and Au, an alloy of ITO and Au, an alloy of Ni, Pt, and Au, and an alloy of Pt and Au.

12. The method of claim 1, wherein the step of forming the first region and the second region in the p-GaN layer comprises:

forming a first insulating layer on the p-GaN layer; and removing the first insulating layer from the first region and the second region of the p-GaN layer so as to expose the p-GaN layer in the first region and the second region, wherein the p-GaN layer is etched away in the regions of the p-GaN layer exposed through the first insulating layer.

13. The method of claim 12, further comprising:

removing any remaining portion of the first insulating layer from the p-GaN layer following the forming of the n⁺-GaN layer in the first region and the second region.

14. The method of claim 13, further comprising:

forming a second insulating layer on a portion of the p-GaN layer located between the first region and the second region in which the n⁺-GaN layer is formed;

forming a gate electrode on the second insulating layer.

15. The method of claim 14, where the second insulating layer is formed on a portion of the p-GaN layer located between the source electrode and the drain electrode so as to be spaced apart from the source electrode and the drain electrode.

16. The method of claim 14, further comprising:

forming a third insulating layer in regions of the n+-GaN layer and the p-GaN layer located between the source electrode and the gate electrode and between the drain electrode and the source electrode.

17. The method of claim 16, wherein the third insulating layer is formed to cover portions of the second insulating layer on which the gate electrode is not formed.

18. The method of claim 1, wherein removing of the substrate from a surface of the p-GaN layer further comprises removing the buffer layer from the surface of the p-GaN layer prior to forming the bonding layer and the thermal conductive substrate.

19. The method of claim 1, wherein the forming of the buffer layer on the substrate comprises forming a first buffer layer on the substrate and forming on the first buffer layer a second buffer layer of a material different than a material of the first buffer layer, and wherein removing of the substrate from a surface of the p-GaN layer further comprises removing the first buffer layer and the second buffer layer from the surface of the p-GaN layer prior to forming the bonding layer and the thermal conductive substrate.

20. The method of claim 1, wherein the bonding layer includes a gold-tin (Au—Sn) alloy.

* * * * *